United States Patent [19]
Maeda et al.

[11] Patent Number: 5,955,211
[45] Date of Patent: Sep. 21, 1999

[54] MAGNETORESISTIVE FILM

[75] Inventors: Atsushi Maeda, Osaka; Satoru Oikawa, Yao, both of Japan

[73] Assignee: Sanyo Electric Co., Ltd., Osaka, Japan

[21] Appl. No.: 08/890,508

[22] Filed: Jul. 9, 1997

[30] Foreign Application Priority Data

Jul. 18, 1996 [JP] Japan ................................. 8-189529

[51] Int. Cl.$^6$ ....................................................... G11B 5/66
[52] U.S. Cl. .............. 428/692; 428/694 R; 428/694 TR; 428/694 T; 428/694 TS; 428/694 TM; 428/900; 360/113; 324/252
[58] Field of Search ......................... 428/694 R, 694 TR, 428/694 T, 694 TS, 694 TM, 692, 900; 360/113; 324/252

[56] References Cited

U.S. PATENT DOCUMENTS 5,549,978   8/1996   Iwasaki .................................... 428/692

OTHER PUBLICATIONS

"Giant Magnetoresistance Effect in Amorphous CoFeB Sandwiches", Jpn. J. Appl. Phys., vol. 34, Jimbo et al, 1995, pp. L112–L114, Part 2, No. 1B, Jan. 15, 1995.

"Giant Magnetoresistance Effect and Electric Conduction in Amorphous–CoFeB/Cu/Co Sandwiches", J. Appl. Phys. vol. 79, No. 8, Apr. 15, 1996, pp. 6237–6239.

Primary Examiner—Leszek Kiliman
Attorney, Agent, or Firm—Nikaido, Marmelstein, Murray & Oram LLP

[57] ABSTRACT

Disclosed is a magnetoresistive film which includes an antiferromagnetic layer, a first amorphous ferromagnetic layer, a crystalline ferromagnetic interlayer disposed between the antiferromagnetic layer and the first amorphous ferromagnetic layer, a nonmagnetic conductive layer provided on the first amorphous ferromagnetic layer and a ferromagnetic layer provided on the nonmagnetic conductive layer.

8 Claims, 15 Drawing Sheets

MAGNETORESISTIVE FILM

BACKGROUND OF THE INVENTION

1. Field of the Invention

The present invention relates to magnetoresistive films for use in reproduce magnetic heads, magnetic sensors or the like.

2. Description of Related Art

A magnetoresistive (MR) element is an element which detects an intensity of magnetic field and its changes by supplying a current to a magnetoresistive film and reading the voltage changes thereacross. An MR head employing such a magnetoresistive element offers a higher detectivity relative to conventional inductive heads, and accordingly increased investigations upon the MR head have been directed to its applications to reproduce magnetic heads such as hard disk drives which demand higher density recording. In order for such a MR head to be feasible in achieving high density recording, it must have a high magnetic field sensitivity As a result, a significant need has arisen for a MR element which exhibits a high MR ratio. A giant magnetoresistive (GMR) element is known as exhibiting such a high MR ratio. Examples of magnetic films for such a GMR element include artificial lattice type magnetic films having ferromagnetic layers alternating with nonmagnetic conductive layers, spin valve type magnetic films having a layered structure consisting of antiferromagnetic/ferromagnetic/nonmagnetic conductive/ferromagnetic layers, coercive force differential type magnetic films having a multilayer structure consisting of ferromagnetic/nonmagnetic conductive/ferromagnetic layers with the ferromagnetic layers having coercive forces different from each other.

A magnetic film for the GMR elements has been proposed by M. Jimbo et al.(J. Appl. Phys., 79 (1966) 6237–6239) which employs an amorphous ferromagnetic layer for the ferromagnetic layer and has a multilayer structure of NiO/a-CoFeB/Cu/a-CoFeB.

However, the MR films employing such an amorphous ferromagnetic layer suffer poor reproducibility in their formation to disadvantageously exhibit varied qualities from film to film. In addition, they exhibit a lower MR ratio than MR films employing a crystalline ferromagnetic layer.

SUMMARY OF THE INVENTION

It is an object of the present invention to provide a magnetoresistive film employing an amorphous ferromagnetic layer which exhibits a high MR ratio and can be manufactured in such a reproducible manner as to insure uniform qualities thereof.

The inventors of the present application have conceivably related the poor reproducibility of the RM films employing the amorphous ferromagnetic layer to a weak magnetic coupling between the antiferromagnetic layer and amorphous ferromagnetic layer. That is, such a weak magnetic coupling have been considered to be readily susceptible to the changes in the film structure due to a slight variation in a film-forming condition to result in the poor reproducibility of the film formation as well as the reduced RM ratio. Therefore, there is a need to find a way of eliminating the above-described problems. The present inventors have now discovered that the placement of crystalline ferromagnetic interlayer between the amorphous ferromagnetic and antiferromagnetic layers results in an enhanced magnetic coupling of the amorphous ferromagnetic layer to the antiferromagnetic layer.

A characteristic feature of the present invention resides in its multilayer structure including antiferromagnetic, first amorphous ferromagnetic, nonmagnetic conductive, and ferromagnetic layers in such an order and further placement of a crystalline ferromagnetic interlayer between the first amorphous ferromagnetic and antiferromagnetic layers.

More specifically, the magnetoresistive film of the present invention includes the antiferromagnetic layer, the crystalline ferromagnetic interlayer, the first amorphous ferromagnetic layer, the nonmagnetic conductive layer, and the ferromagnetic layer in such an order. The crystalline ferromagnetic interlayer is ferromagnetically coupled to the first amorphous ferromagnetic layer, so that the ferromagnetically coupled crystalline ferromagnetic interlayer and first amorphous ferromagnetic layer are magnetically coupled to the antiferromagnetic layer.

The provision of the crystalline ferromagnetic interlayer between the antiferromagnetic and first amorphous ferromagnetic layers in accordance with the present invention allows the antiferromagnetic layer to be strongly exchange coupled to the crystalline ferromagnetic interlayer and the first amorphous ferromagnetic layer. This imparts thereto an enhanced pinch effect of the first amorphous ferromagnetic layer to result in an increased MR ratio. Also, since the antiferromagnetic layer is strongly magnetically coupled to the crystalline ferromagnetic interlayer and first amorphous ferromagnetic layer, the magnetoresistive film is little susceptible to the variations in film-forming condition so that it can be fabricated in such a reproducible manner to insure uniformity in quality level of the resulting films.

The crystalline ferromagnetic interlayer in accordance with the present invention may be comprised of Fe, Co, Ni and alloys thereof, for example. Of the above, NiFe, NiCo, CoFe, NiFeCo are particularly preferred. The thickness of the crystalline ferromagnetic interlayer is not particularly limited, but is generally in the range of 5–50 Å.

In the present invention, at least one of the ferromagnetic layers for flanking the nonmagnetic conductive layer therebetween is specified to be the amorphous ferromagnetic layer. Accordingly, in a particular embodiment, first and second amorphous ferromagnetic layers may be employed to flank the nonmagnetic conductive layer therebetween.

Suitable materials for the amorphous ferromagnetic layer in accordance with the present invention include CoFeB, CoNb, CoZr, CoZrNb, CoTa, CoTaZr, CoNbTa, CoB, CoFeZr, CoFeTa, CoFeNb, CoNiB, CoNiZr, CoNiTa and CoNiNb, for example. These alloys may additionally contain a small amount of metal such as Cr. The thickness of the amorphous ferromagnetic layer is generally in the range of 5–100 Å.

One of the ferromagnetic layers for flanking the nonmagnetic conductive layer may not be amorphous. Even in such an event, the thickness of such a ferromagnetic layer may be set generally in the range of 5–100 Å. Apart from the amorphous ferromagnetic layer, the crystalline ferromagnetic layer may consist of NiFe, Fe, Co or alloys thereof, for example.

The antiferromagnetic layer for use in the present invention may consist of FeMn, NiMn, IrMn, NiO, CoO or NiCoO, for example. The thickness of the antiferromagnetic layer is generally in the range of 30–300 Å.

Any material which is nonmagnetic and excellent in electric conductivity can be employed for the nonmagnetic conductive layer in accordance with the present invention. Representative of such materials are Cu and Ag. The thickness of the nonmagnetic conductive layer is generally in the range of 10–50 Å.

The magnetoresistive film of the present invention can be fabricated by sequentially forming the layers on a substrate. In this instance, the layers may be formed on the substrate in the order of the antiferromagnetic, crystalline ferromagnetic, first amorphous ferromagnetic, nonmagnetic conductive and ferromagnetic layers. Alternatively, such an order may be inverted. That is, the layers may be formed on the substrate in the order of the ferromagnetic layer, the nonmagnetic conductive layer, the first amorphous ferromagnetic layer, the crystalline ferromagnetic interlayer and the antiferromagnetic layer. The substrate may be made of any suitable nonmagnetic material such as Si, TiC, $Al_2O_3$ or glass, for example.

Also, the magnetoresistive film of the present invention may have a multilayer structure in which the layered sequence of the above-described five-layer structure is repeated two or more times.

In accordance with the present invention, the crystalline ferromagnetic interlayer is provided between the antiferromagnetic and first amorphous ferromagnetic layers. The provision of the crystalline ferromagnetic interlayer allows the first amorphous ferromagnetic layer to be ferromagnetically coupled thereto, so that these ferromagnetically coupled layers are magnetically coupled to the antiferromagnetic layer. Although not intended to limit the scope of the invention, it is believed that the relatively strong ferromagnetic coupling between the crystalline ferromagnetic interlayer and the first amorphous ferromagnetic layer as well as the relatively strong magnetic coupling between the antiferromagnetic layer and those two layers allow the magnetization mechanism of magnetoresistive film to shift from a conventional type similar to that of the coercive force differential type magnetic film to a more stable spin valve type, resulting in its reproducible high MR ratio.

DESCRIPTION OF THE PREFERRED EMBODIMENTS

Figure 1:
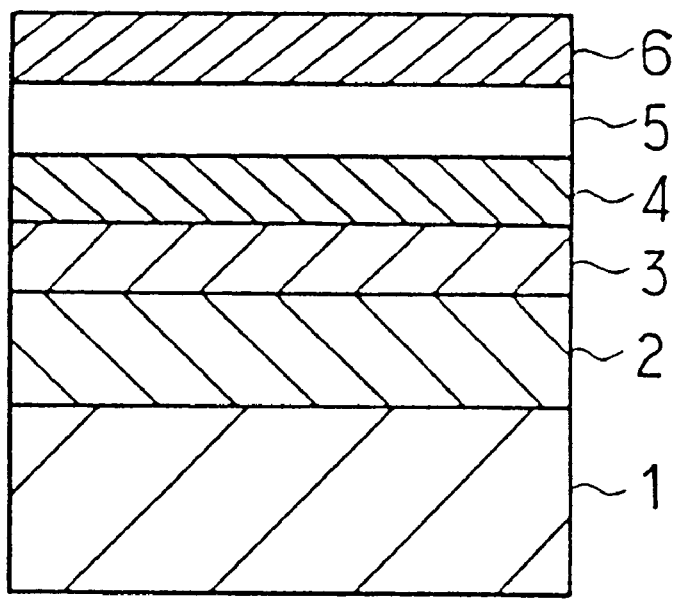
FIG. 1 is a cross-sectional view of a first embodiment of the magnetoresistive film in accordance with the present invention.

FIG. 1 is a cross-sectional view of a first embodiment of the magnetoresistive film in accordance with the present invention. With reference to FIG. 1, a magnetoresistive film in accordance with this embodiment can be established by sequentially forming on a substrate 1 such as of glass an antiferromagnetic layer 2 of $Ni_{50}O_{50}$ (10 nm thick), a crystalline ferromagnetic interlayer 3 of $Ni_{80}Fe_{20}$ (2 nm thick), a first amorphous ferromagnetic layer 4 of $(Co_{0.9}Fe_{0.1})_{20}B_{80}$ (2 nm thick), a nonmagnetic conductive layer 5 of Cu (2 nm thick), and a second amorphous ferromagnetic layer 6 of $(Co_{0.9}Fe_{0.1})_{20}B_{80}$ (2 nm thick).

Figure 2A:
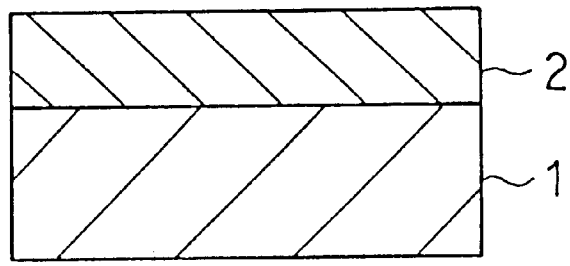
FIGS. 2(a) through 2(c) are a set of cross-sectional views, showing a fabrication process of the film embodiment of FIG. 1.
Figure 2B:
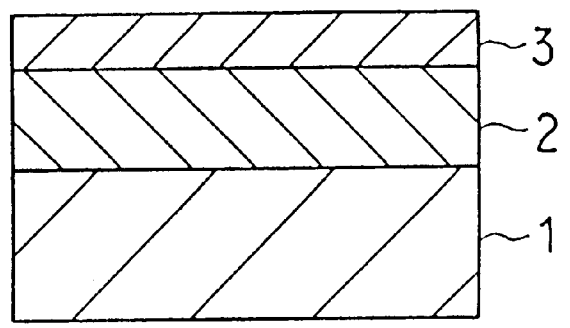
Figure 2C:
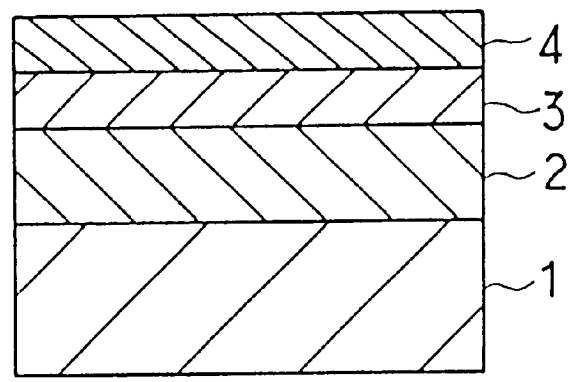
Figure 3D:
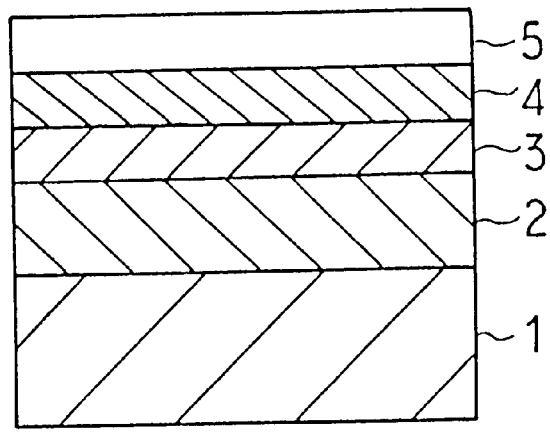
FIGS. 3(d) and 3(e) are a set of cross-sectional views, showing the fabrication process of the film embodiment of FIG. 1.
Figure 3E:
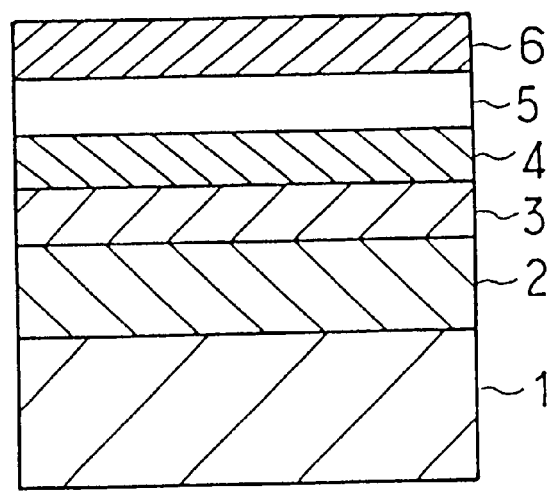

FIGS. 2 and 3 are schematic cross-sectional views, respectively, showing a process for fabricating the magnetoresistive film embodiment of FIG. 1. As illustrated in FIG. 2(a), the antiferromagnetic layer 2 is formed on the glass substrate 1 such as by an ion beam sputtering technique. The crystalline ferromagnetic interlayer 3 is then formed on the antiferromagnetic layer 2 such as by the ion beam sputtering technique, as illustrated in FIG. 2(b). As shown in FIG. 2(c), the first amorphous ferromagnetic layer 4 is subsequently formed on the crystalline ferromagnetic interlayer 3 such as by the ion beam sputtering technique.

Then, the nonmagnetic conductive layer 5 is formed on the first amorphous ferromagnetic layer 4 such as by an ion beam sputtering technique. Finally, the second amorphous ferromagnetic layer 6 is formed on the nonmagnetic conductive layer 5 such as by the ion beam sputtering technique.

The magnetoresistive film can be thus fabricated which has a multilayer structure as shown in FIG. 1. Although each layer is described above to be formed by the ion beam sputtering technique, other techniques including a RF plasma CVD process can be employed to form any of the layers.

Figure 4:
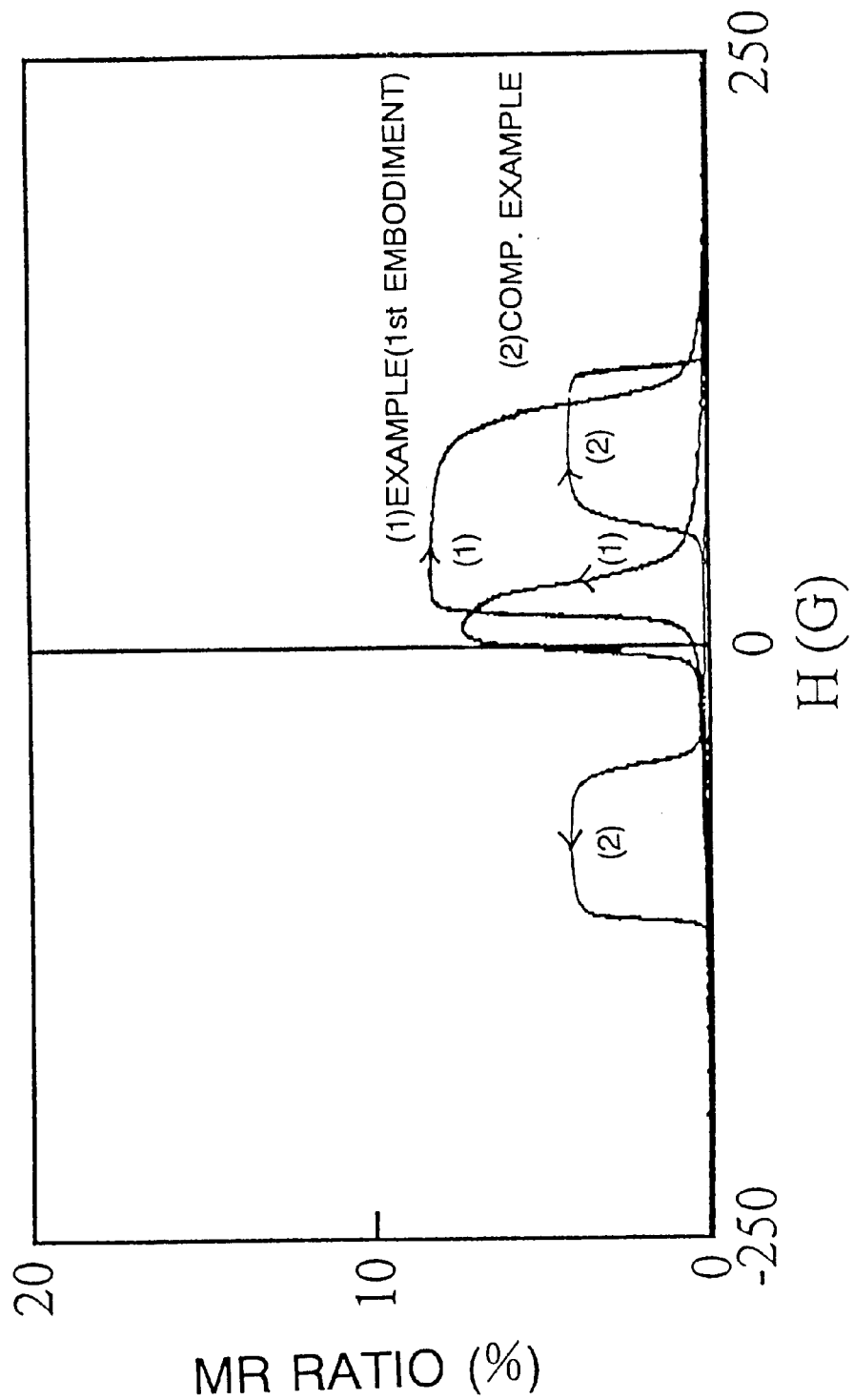
FIG. 4 is a graph showing variations of MR ratio according to magnetic field changes of the first embodiment, shown in FIG. 1, of the magnetoresistive film in accordance with the present invention.

FIG. 4 is a graph showing variations of MR ratio according to magnetic field changes of the first embodiment, shown in FIG. 1, of the magnetoresistive film in accordance with the present invention. In FIG. 4, a curve (1) shows the changes in MR ratio of the first embodiment, shown in FIG. 1, of the magnetoresistive film in accordance with the present invention, and a curve (2) shows the changes in MR ratio of the comparative magnetoresistive film. The crystalline ferromagnetic interlayer is not incorporated in the comparative magnetoresistive film which accordingly forms the first amorphous ferromagnetic layer directly on the antiferromagnetic layer. That is, the comparative magnetoresistive film is such a magnetoresistive film that excludes the crystalline ferromagnetic interlayer 3 from the magnetoresistive film of FIG. 1 and forms the first amorphous ferromagnetic layer 4 directly on the antiferromagnetic layer.

As apparent from FIG. 4, the first embodiment of the magnetoresistive film in accordance with the present invention reveals a value of about 8% for a maximum MR ratio. Its maximum MR ratio is apparently higher than a 4% maximum MR ratio of the comparative magnetoresistive film which incorporates no crystalline ferromagnetic interlayer between the antiferromagnetic and first amorphous ferromagnetic layers.

Figure 5:
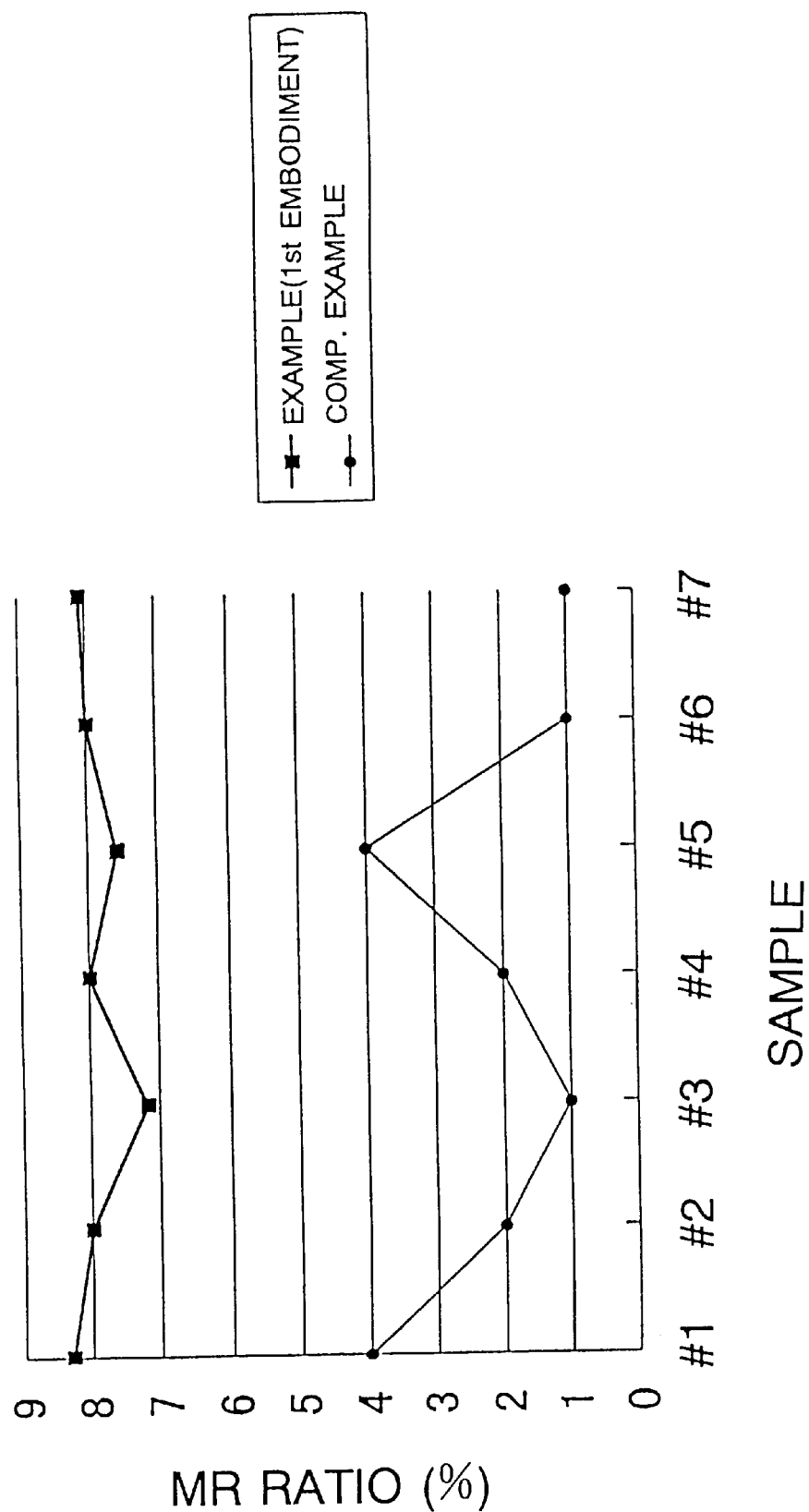
FIG. 5 is a graph showing sample variances in maximum MR ratio of the first embodiment of the magnetoresistive film in accordance with the present invention.

The first embodiment of the magnetoresistive film in accordance with the present invention was repeatedly fabricated to prepare seven samples (Sample 1 through Sample 7). FIG. 5 shows a plot of the maximum MR ratio for each sample. For comparative purposes, the comparative magnetoresistive film which incorporated no crystalline ferromagnetic layer to exhibit the MR ratio curve (2) in FIG. 4 was repeatedly fabricated to prepare seven samples (Sample 1 through Sample 7). FIG. 5 also shows a plot of the maximum MR ratio for each sample of the comparative magnetoresistive film. As apparent from FIG. 5, the comparative magnetoresistive film incorporating no crystalline ferromagnetic layer exhibits larger sample variances in maximum MR ratio. In contrast, the first embodiment of the magnetoresistive film in accordance with the present invention exhibits rather smaller sample variances in maximum MR ratio, i.e. a substantially constant MR ratio. This demonstrates that the magnetoresistive film in accordance with the present invention can be fabricated in such a reproducible manner to keep its quality level.

Figure 6:
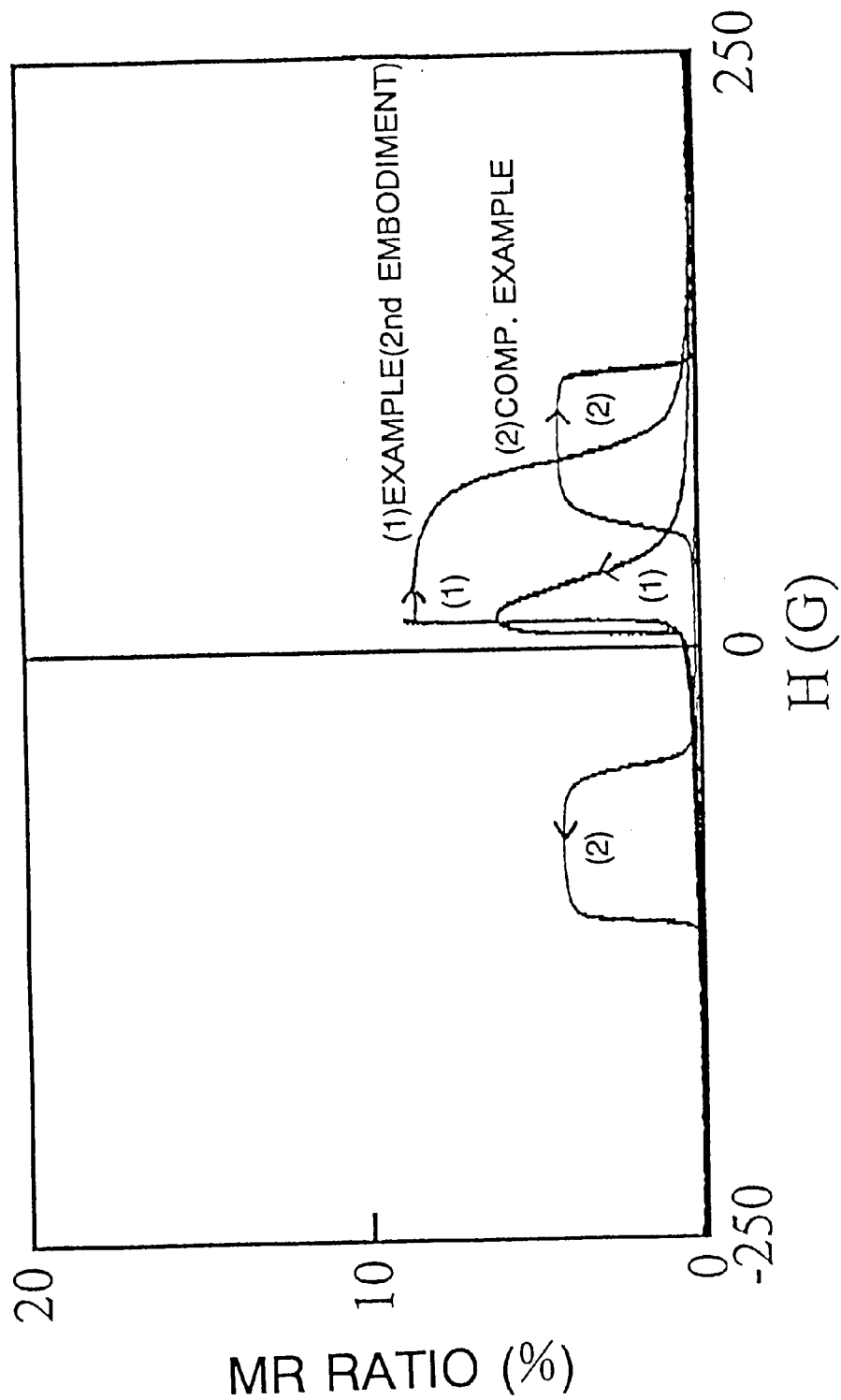
FIG. 6 is a graph showing variations of MR ratio with magnetic field changes of a second embodiment of the magnetoresistive film in accordance with the present invention.

FIG. 6 is a graph showing variations in MR ratio with magnetic field changes of a second embodiment of the magnetoresistive film in accordance with the present invention. In the second embodiment of the magnetoresistive film in accordance with the present invention, a crystalline ferromagnetic interlayer of $Ni_{14}Fe_{13}Co_{73}$ (2 nm thick) is used as the crystalline ferromagnetic interlayer 3 shown in FIG. 1. Excluding the crystalline ferromagnetic interlayer 3, the material type and thickness of each layer of the film was identical to the corresponding layer of the above-described first film embodiment. In FIG. 6, a curve (1) shows variations in MR ratio of the second embodiment of the magnetoresistive film. A curve (2) in FIG. 6 shows variations in MR ratio of the comparative magnetoresistive film incorporating no crystalline ferromagnetic layer, as analogous to the curve (2) in FIG. 4. As can be seen from FIG. 6, the second embodiment of the magnetoresistive film in accordance with the present invention reveals a value of about 8% for a maximum MR ratio which is apparently higher than those of conventional films.

Figure 7:
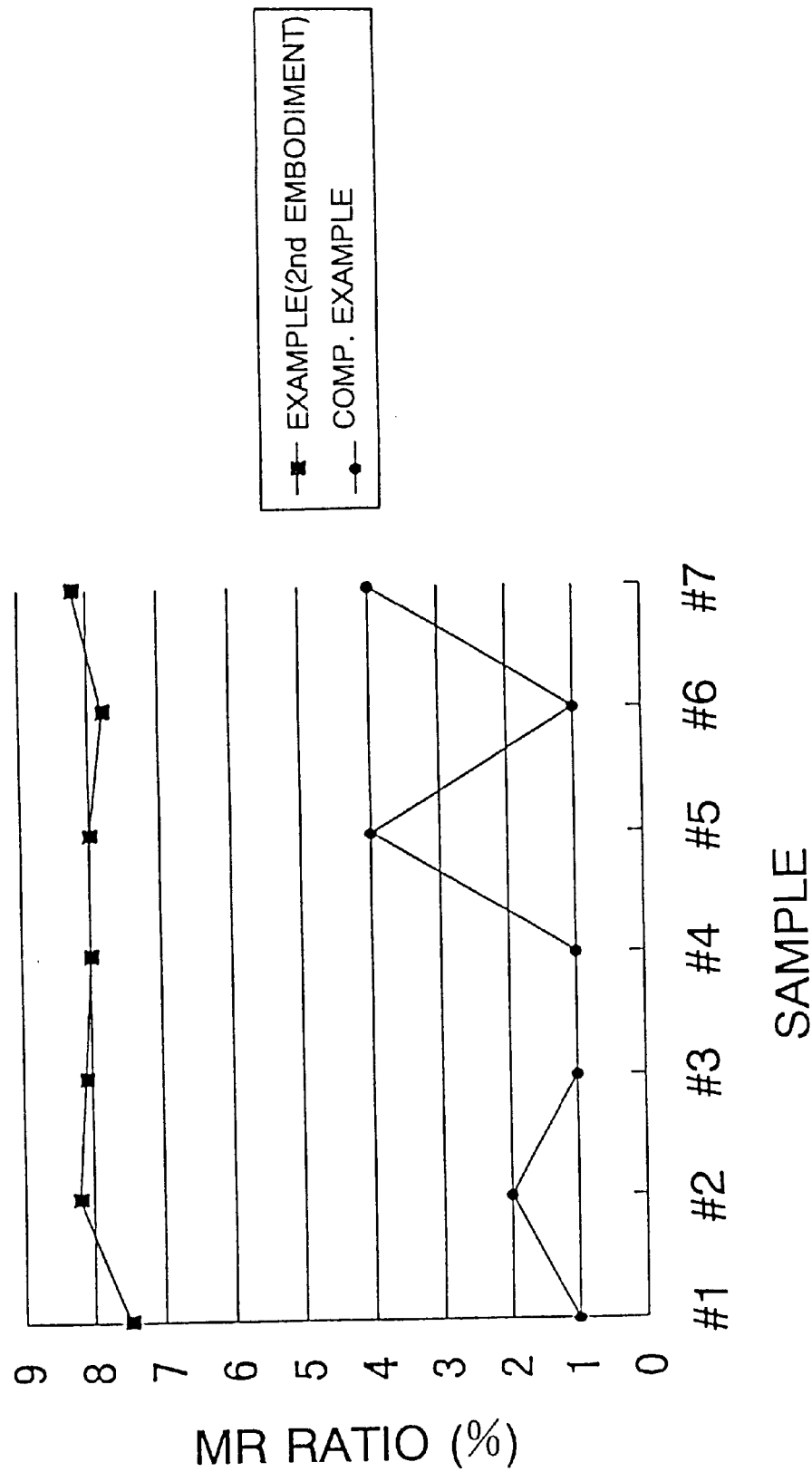
FIG. 7 is a graph showing sample variances in maximum MR ratio of the second embodiment of the magnetoresistive film in accordance with the present invention.

The second embodiment of the magnetoresistive film in accordance with the present invention was repeatedly fabricated to prepare seven samples (Sample 1 through Sample 7). FIG. 7 shows a plot of the maximum MR ratio for each sample to indicate sample variances in MR ratio. For comparative purposes, the comparative magnetoresistive film which incorporated no crystalline ferromagnetic layer to exhibit the MR ratio curve (2) in FIG. 6 was repeatedly fabricated to prepare seven samples (Sample 1 through Sample 7). FIG. 7 also shows a plot of the maximum MR ratio for each sample of the comparative magnetoresistive film to indicate sample variances in MR ratio. As apparent from FIG. 7, the second embodiment of the magnetoresistive film in accordance with the present invention exhibits rather smaller sample variances in maximum MR ratio. This demonstrates that the second embodiment of the magnetoresistive film can be fabricated in such a reproducible manner to keep its quality level.

In the above embodiments, formed on the substrate 1 is the antiferromagnetic layer 2 on which the remaining layers are sequentially formed. Alternatively, the sequence of the layers to be formed may be inverted. That is, those layers may be formed on the substrate 1 in the order of second amorphous ferromagnetic layer 6, nonmagnetic conductive layer 5, first amorphous ferromagnetic layer 4, crystalline ferromagnetic interlayer 3 and antiferromagnetic layer 2.

Figure 8:
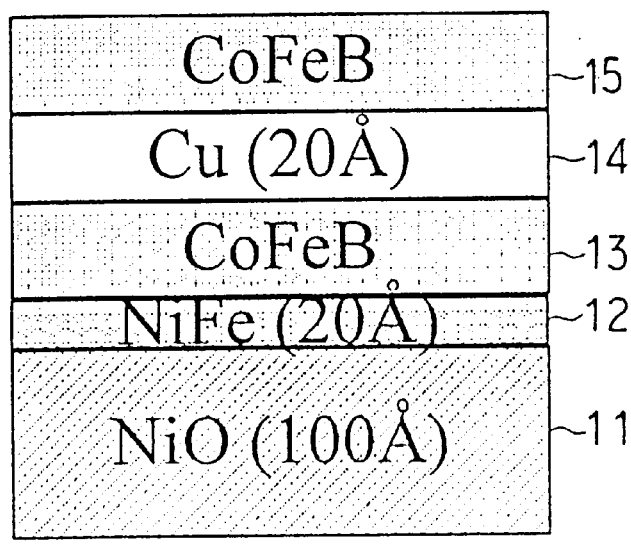
FIG. 8 is a schematic cross-sectional view showing a specific structure embodiment of the magnetoresistive film in accordance with the present invention when the thickness of amorphous ferromagnetic layer is varied to investigate its influence.
Figure 9:
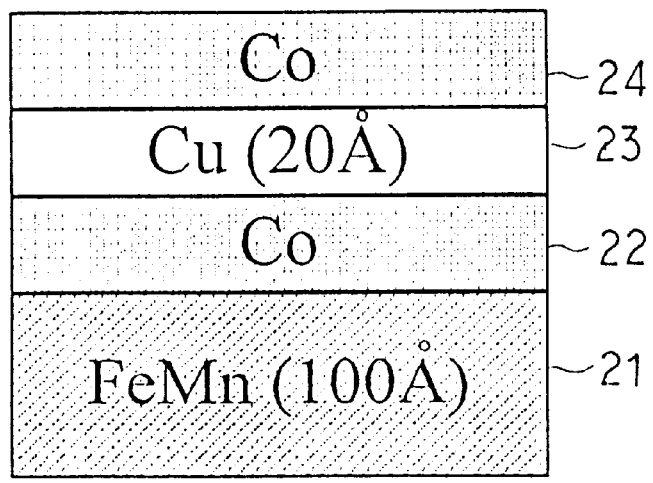
FIG. 9 is a schematic cross-sectional view showing a comparative structure of a conventional magnetoresistive film when the thickness of ferromagnetic layer is varied to investigate its influence.
Figure 10:
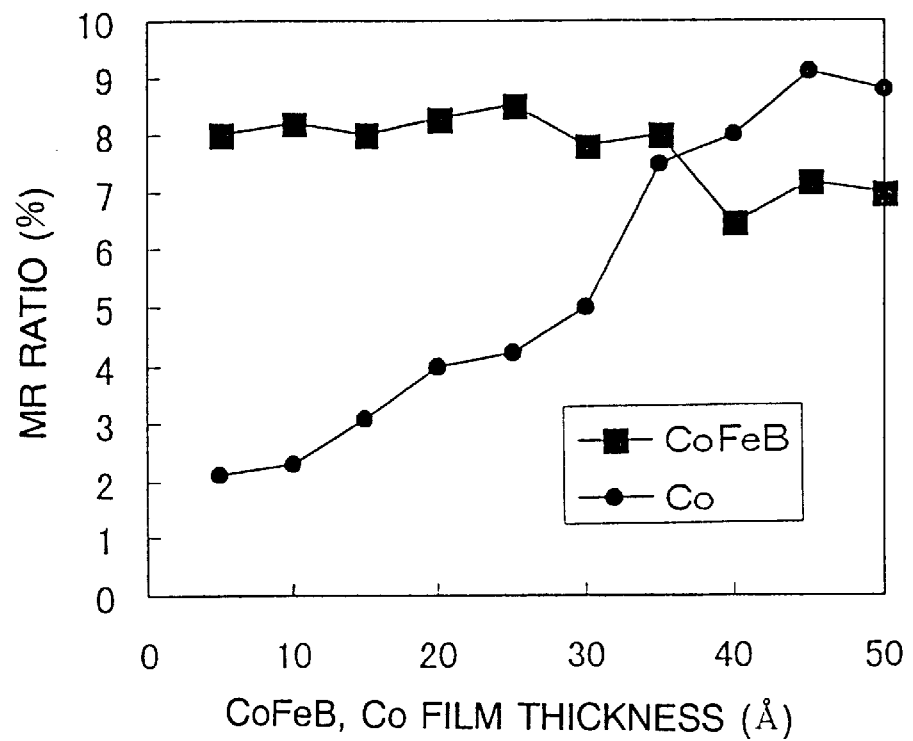
FIG. 10 is a graph showing changes in MR ratio with varied thickness respectively of the amorphous ferromagnetic layer in the present magnetoresistive film and the ferromagnetic layer in the comparative magnetoresistive film.
Figure 11:
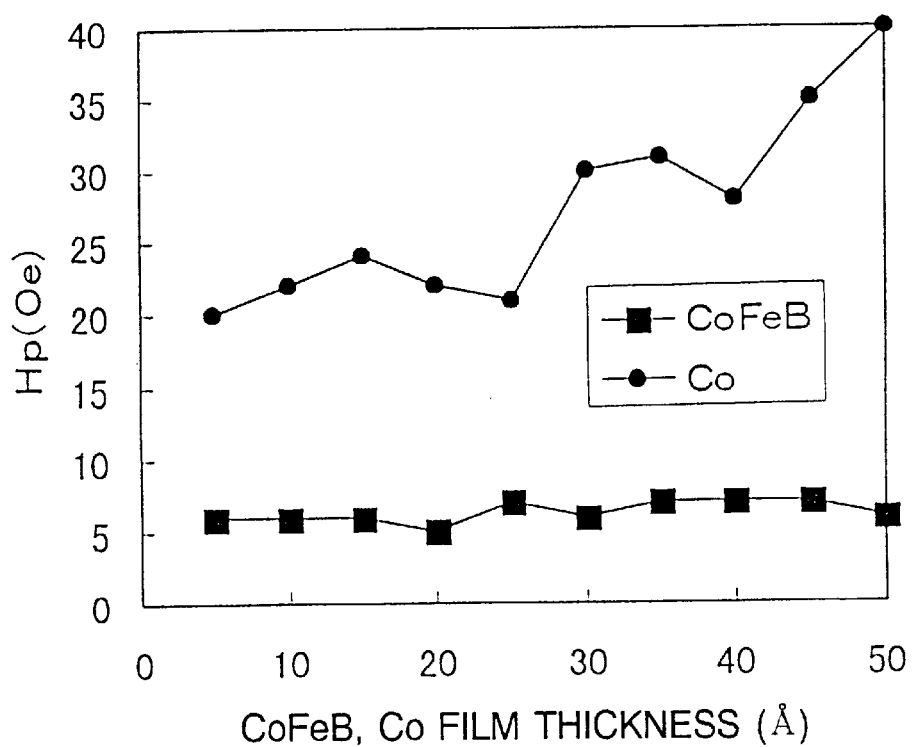
FIG. 11 is a graph showing changes in operating magnetic field according to varied thicknesses respectively of the amorphous ferromagnetic layer of the present magnetoresistive film and the ferromagnetic layer of the comparative magnetoresistive film.

Next, the investigation was made as to the influence imposed by variations in thickness of the amorphous ferromagnetic layer in the magnetoresistive film of the present invention. As illustrated in FIG. 8, sequentially formed on a NiO antiferromagnetic layer 11 (100 Å) are a NiFe crystalline ferromagnetic layer 12 (20 Å), a first CoFeB amorphous ferromagnetic layer 13, a Cu nonmagnetic conductive layer 14 (20 Å) and a second CoFeB amorphous ferromagnetic layer 15. While the thicknesses of NiO antiferromagnetic layer 11, NiFe crystalline ferromagnetic layer 12 and Cu nonmagnetic conductive layer 14 were respectively maintained constant, the thicknesses of CoFeB amorphous ferromagnetic layers 13 and 15 were varied as shown in FIGS. 10 and 11 to measure the changes in MR ratio (FIG. 10) and the changes in operating magnetic field (Hp) (FIG. 11) in accordance therewith. For comparative purposes, the investigation was also made as to the influence imposed by variations in thickness of a ferromagnetic layer in a conventional magnetoresistive film of FIG. 9. As illustrated in FIG. 9, such a comparative magnetoresistive film has a FeMn antiferromagnetic layer 21 (100 Å) on which a Co ferromagnetic layer 22 a Cu nonmagnetic conductive layer 23 (20 Å) and a Co ferromagnetic layer 24 are sequentially formed. While the thicknesses of FeMn antiferromagnetic layer 21 and Cu nonmagnetic conductive layer 23 were respectively maintained constant, the thicknesses of Co ferromagnetic layers 22 and 24 were varied to measure the changes in MR ratio (FIG. 10) and the changes in operating magnetic field (Hp) (FIG. 11) in accordance therewith.

Figure 12:
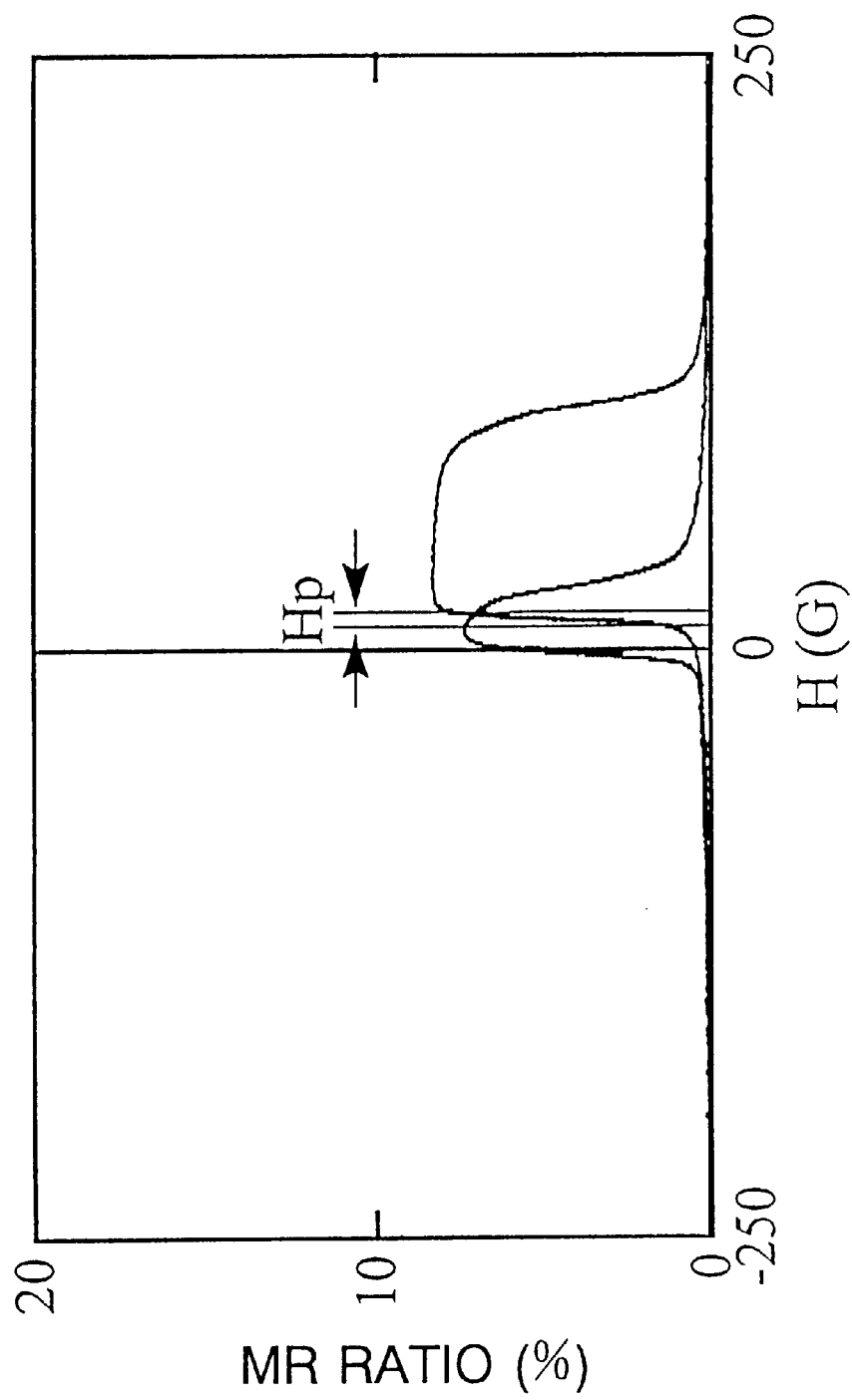
FIG. 12 is a graph for explaining the operating magnetic field (Hp) in FIG. 11.

FIG. 12 is a graph explaining the operating magnetic field (Hp). Referring to FIG. 12, the operating magnetic field (Hp) is indicated as corresponding to a magnetic field width wherein the MR ratio changes linearly. Accordingly, a higher magnetic sensitivity can be obtained as the operating magnetic field (Hp) becomes narrower.

As can be seen from FIG. 10, the magnetoresistive film (CoFeB) in accordance with the present invention exhibits a substantially constant, high MR ratio even when the thickness of its amorphous ferromagnetic layer is varied within the range of 5–50 Å. On the contrary, it is shown that the comparative magnetoresistive film (Co) exhibits reduction in MR ratio as the ferromagnetic layer becomes thinner.

In addition, the magnetoresistive film (CoFeB) in accordance with the present invention exhibits a substantially constant, low operating magnetic field even when the thickness of its amorphous ferromagnetic layer is varied within the range of 5–50 Å, as can be appreciated from FIG. 11. On the contrary, it is shown that the comparative magnetoresistive film (Co) exhibits an increase in operating magnetic field intensity to result in its poorer magnetic field sensitivity as the ferromagnetic layer therein becomes thicker. As will be recognized from FIGS. 10 and 11 it is a marked disadvantage of the comparative magnetoresistive film that the increased thickness of its ferromagnetic layer in an attempt to obtain a higher MR ratio adversely acts to reduce the operating magnetic field sensitivity. On the other hand, the magnetoresistive film in accordance with the present invention is little influenced by the changes in thickness of the ferromagnetic layer to constantly exhibit a high MR ratio as well as an is adequate magnetic field sensitivity.

Figure 13:
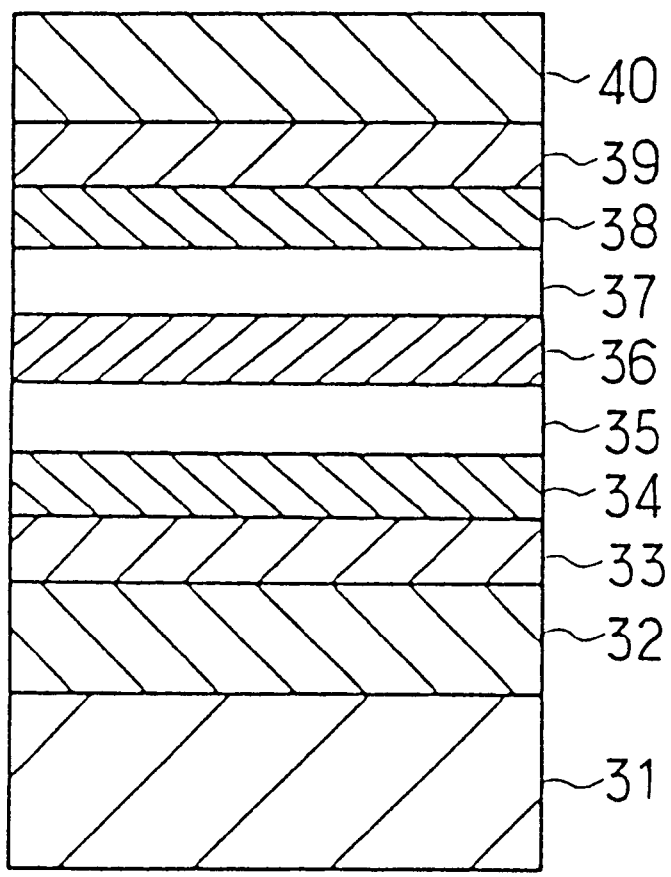
FIG. 13 is a cross-sectional view of a third embodiment of the magnetoresistive film in accordance with the present invention.

FIG. 13 is a cross-sectional view of a third embodiment of the magnetoresistive film in accordance with the present invention. In the embodiment as illustrated in FIG. 13, a magnetoresistive film has a multilayer structure wherein layers are formed on a substrate 31 in the order of antiferromagnetic layer 32, crystalline ferromagnetic interlayer 33, first amorphous ferromagnetic layer 34, nonmagnetic conductive layer 35, second amorphous ferromagnetic layer 36, nonmagnetic conductive layer 37, first amorphous ferromagnetic layer 38, crystalline ferromagnetic interlayer 39 and antiferromagnetic layer 40. The antiferromagnetic layer 32 is formed of $Ni_{50}O_{50}$ to a thickness of 10 nm, for example. The crystalline ferromagnetic interlayers 33 and 39 are formed of $Ni_{80}Fe_{20}$ or $Ni_{14}Fe_{13}Co_{73}$ to a thickness of 2 nm, for example. The first and second amorphous ferromagnetic layers 34, 36 and 38 are formed of $(Co_{0.9}Fe_{0.1})_{20}B_{80}$ to a thickness of 2 nm, for example. The nonmagnetic conductive layers 35 and 37 are formed of Cu to a thickness of 2 nm, for example.

Figure 14:
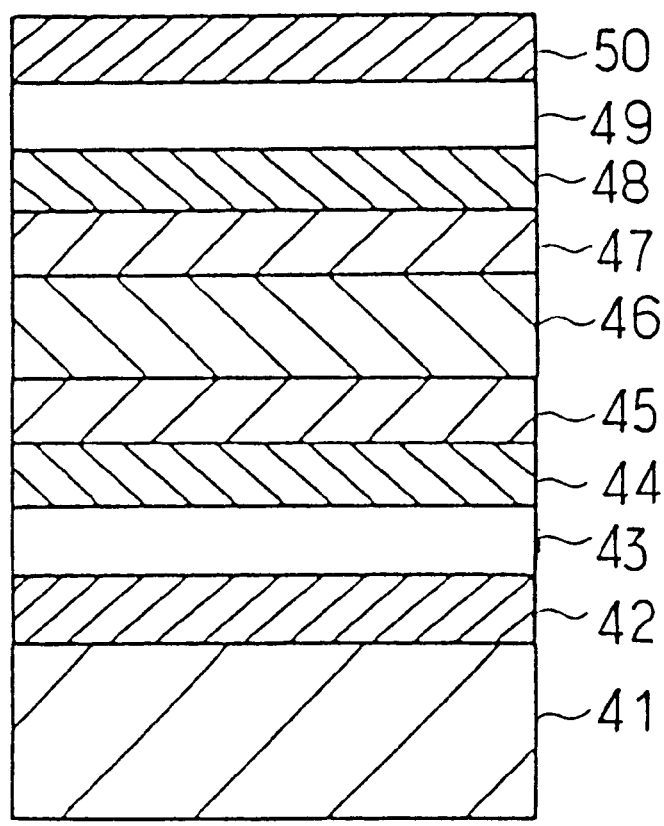
FIG. 14 is a cross-sectional view of a fourth embodiment of the magnetoresistive film in accordance with the present invention.

FIG. 14 is a cross-sectional view of a fourth embodiment of the magnetoresistive film in accordance with the present invention. In the embodiment as illustrated in FIG. 14, a magnetoresistive film has a multilayer structure wherein layers are formed on a substrate 41 in the order of second amorphous ferromagnetic layer 42, nonmagnetic conductive layer 43, first amorphous ferromagnetic layer 44, crystalline ferromagnetic interlayer 45, antiferromagnetic layer 46, crystalline ferromagnetic interlayer 47, first amorphous ferromagnetic layer 48, nonmagnetic conductive layer 49 and second amorphous ferromagnetic layer 50.

The first and second amorphous ferromagnetic layers 42, 44, 48 and 50 are formed of $(Co_{0.9}Fe_{0.1})_{20}B_{80}$ to a thickness of 2 nm, for example. The nonmagnetic conductive layers 43 and 49 are formed of Cu to a thickness of 2 nm, for example. The crystalline ferromagnetic interlayers 45 and 47 are formed of $Ni_{80}Fe_{20}$ or $Ni_{14}Fe_{13}Co_{73}$ to a thickness of 2 nm, for example. The antiferromagnetic layer 46 is formed of $Ni_{50}O_{50}$ to a thickness of 10 nm, for example.

Also, the magnetoresistive film of the present invention may be of a multilayer structure in which the layered sequence of the above-specified five-layer structure is twice repeated, such as comprising antiferromagnetic/crystalline ferromagnetic inter-/first amorphous ferromagnetic/ nonmagnetic conductive/ferromagnetic/nonmagnetic conductive/first amorphous ferromagnetic/crystalline ferromagnetic inter-/antiferromagnetic layers. Furthermore, the magnetoresistive film of the present invention may be of a multilayer structure in which the layered sequence of the above-specified five-layer structure is thrice repeated, such as comprising antiferromagnetic/crystalline ferromagnetic inter-/first amorphous ferromagnetic/nonmagnetic conductive/ferromagnetic/nonmagnetic conductive/first amorphous ferromagnetic/crystalline ferromagnetic inter-/ antiferromagnetic/crystalline ferromagnetic inter-/first amorphous ferromagnetic/nonmagnetic conductive/ ferromagnetic layers.

As described above, the magnetoresistive film of the present invention may be of multilayer structure in which the layered sequence of the above-specified five-layer structure is two or more times repeated.

Figure 15:
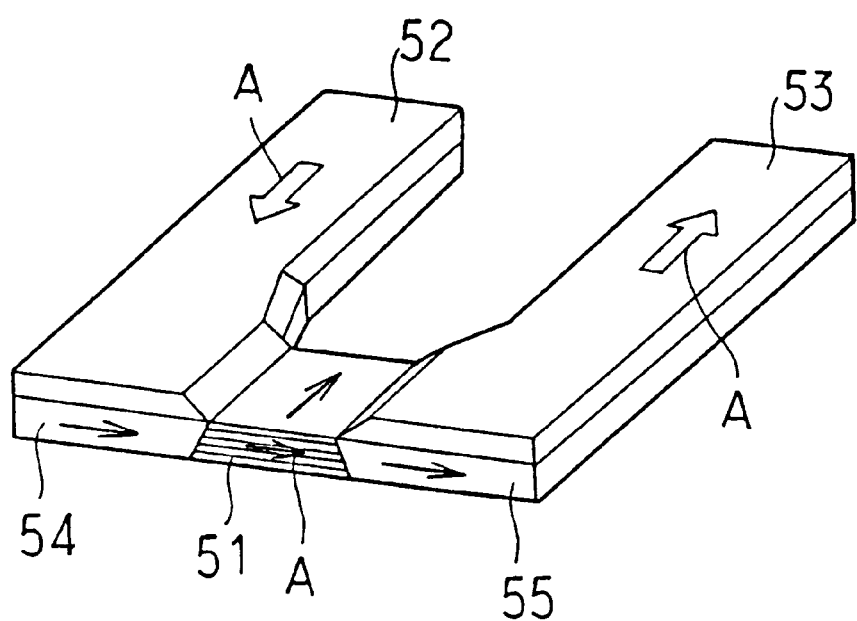
FIG. 15 is a schematic perspective view showing an exemplary structure of a magnetoresistive element employing the magnetoresistive film of the present invention.

FIG. 15 is a schematic perspective view showing an exemplary structure of a magnetoresistive element employing the magnetoresistive film of the present invention. Referring to FIG. 15, a multilayer magnetoresistive film 51 is laterally interposed between a pair of longitudinally biased layers 54 and 55 such as of CoCrPt, on which respective lead electrodes 52 and 53 such as of Au are provided. As indicated by an arrow A, a current supplied from the lead electrode 52 flows through the longitudinally biased layer 54, the magnetoresistive film 51 and the longitudinally biased layer 55 into the lead electrode 53. In addition to supplying the current from the lead electrode 52, the magnetoresistive element is designed to read changes in voltage across the magnetoresistive film 51 for detection of magnetic field intensity and variations thereof.

Figure 16:
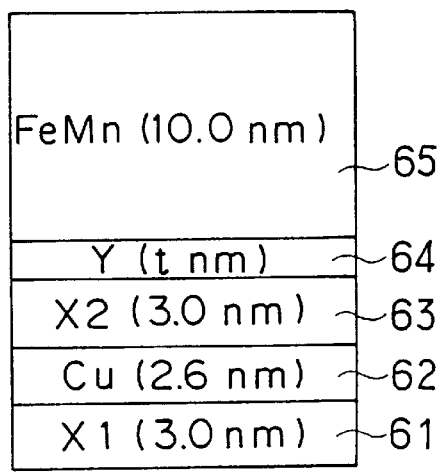
FIG. 16 is a cross-sectional view of a fifth embodiment of the magnetoresistive film in accordance with the present invention.

FIG. 16 is a cross-sectional view of a fifth embodiment of the magnetoresistive film in accordance with the present invention. In this embodiment, various materials were employed respectively for the crystalline ferromagnetic interlayer and the first amorphous ferromagnetic layer to measure variations in exchange coupling magnetic field Hua between the antiferromagnetic layer, and the crystalline ferromagnetic interlayer and the first amorphous ferromagnetic layer. Referring to FIG. 16, a magnetoresistive film includes a second amorphous ferromagnetic layer 61 of material X1 (3.0 nm thick) on which a nonmagnetic conductive layer 62 of Cu (2.6 nm thick) is placed. The nonmagnetic conductive layer 62 carries thereon a first amorphous ferromagnetic layer 63 of material X2 (3.0 nm thick) on which a crystalline ferromagnetic interlayer 64 of material Y (t nm thick) is mounted. Provided on the crystalline ferromagnetic interlayer 64 is an antiferromagnetic layer 65 of FeMn (10.0 nm thick).

Figure 17:
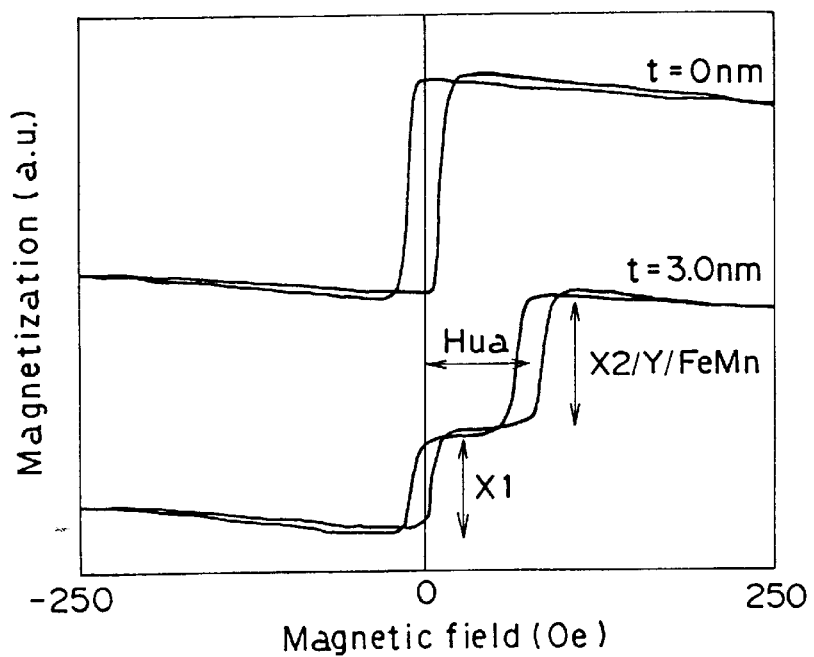
FIG. 17 is a graph showing magnetic field-magnetization curves for the embodiment of the magnetoresistive film as shown in FIG. 16.

FIG. 17 shows magnetic field-magnetization curves for the fifth embodiment of the magnetoresistive film wherein $Co_{95}Zr_5$ were used as the materials X1 and X2 for respectively constituting the second amorphous ferromagnetic layer 61 and the first amorphous ferromagnetic layer 63, and $Ni_{80}Fe_{20}$ was used as the material Y for constituting the crystalline ferromagnetic interlayer 64, and the thickness t of the crystalline ferromagnetic interlayer 64 was set to 3.0 nm. FIG. 17 also shows magnetic field-magnetization curves for a comparative magnetoresistive film wherein the thickness t of the crystalline ferromagnetic interlayer 64 was set to 0 nm, i.e. excluding the crystalline ferromagnetic interlayer 64, for comparative purposes. In FIG. 17, a range represented by "X1" indicates a hysteresis due to changes in magnetic moment of the second amorphous ferromagnetic layer 61, and a range represented by "X2/Y/FeMn" indicates a hysteresis due to changes in magnetic moment of the first amorphous ferromagnetic layer 63, the crystalline ferromagnetic interlayer 64 and the antiferromagnetic layer 65 which are exchange coupled to each other. As can be seen from FIG. 17, setting the thickness of crystalline ferromagnetic layer 64 to 3.0 nm allows the antiferromagnetic layer 65 to be exchange coupled to the crystalline ferromagnetic interlayer 64 and the first amorphous ferromagnetic layer 63 to thereby produce the exchange coupling magnetic field Hua.

Next, various materials were selected for the first and second amorphous ferromagnetic layers and crystalline ferromagnetic interlayer to prepare magnetoresistive films. The magnetoresistive films thus obtained were measured for exchange coupling magnetic field Hua. Firstly, measurements of exchange coupling magnetic field Hua for a magnetoresistive film were made which employed a material a-CoX for the first and second amorphous ferromagnetic layers and a material Y for the crystalline ferromagnetic interlayer. The results, as well as the types of the materials a-CoX and Y employed, are shown in the following Table 1.

TABLE 1

| a-CoX/Y | | |
|---|---|---|
| X | Y | Hua(Oe) |
| B | $Ni_{80}Fe_{20}$ | 125 |
| Zr | $Ni_{80}Fe_{20}$ | 115 |
| Ta | $Ni_{80}Fe_{20}$ | 115 |
| Nb | $Ni_{80}Fe_{20}$ | 135 |
| B | $Ni_{20}Co_{80}$ | 125 |
| Zr | $Ni_{20}Co_{80}$ | 120 |
| Ta | $Ni_{20}Co_{80}$ | 120 |
| Nb | $Ni_{20}Co_{80}$ | 125 |
| B | $Co_{20}Fe_{80}$ | 130 |
| Zr | $Co_{20}Fe_{80}$ | 115 |
| Ta | $Co_{20}Fe_{80}$ | 125 |
| Nb | $Co_{20}Fe_{80}$ | 120 |

In the above Table 1, the X content was in the range of 2–20 atomic percent.

Secondly, magnetoresistive films were prepared which employed a material a-$(Co_{0.9}Ni_{0.1})X$ for the first and second amorphous ferromagnetic layers and a material Y for the crystalline ferromagnetic interlayer and measured for exchange coupling magnetic field Hua. The results, as well as the types of the materials a-$(Co_{0.9}Ni_{0.1})X$ and Y, are shown in the following Table 2.

TABLE 2

| a-$(Co_{0.9}Ni_{0.1})X/Y$ | | |
|---|---|---|
| X | Y | Hua(Oe) |
| B | $Ni_{80}Fe_{20}$ | 130 |
| Zr | $Ni_{80}Fe_{20}$ | 115 |
| Ta | $Ni_{80}Fe_{20}$ | 125 |
| Nb | $Ni_{80}Fe_{20}$ | 120 |
| B | $Ni_{20}Co_{80}$ | 125 |
| Zr | $Ni_{20}Co_{80}$ | 115 |
| Ta | $Ni_{20}Co_{80}$ | 115 |
| Nb | $Ni_{20}Co_{80}$ | 135 |
| B | $Co_{20}Fe_{80}$ | 125 |
| Zr | $Co_{20}Fe_{80}$ | 120 |
| Ta | $Co_{20}Fe_{80}$ | 120 |
| Nb | $Co_{20}Fe_{80}$ | 125 |

In the above Table 2, the X content was in the range of 2–20 atomic percent.

Thirdly, magnetoresistive films were prepared which employed a material a-$(Co_{0.9}Fe_{0.1})X$ for the first and second amorphous ferromagnetic layers and a material Y for the crystalline ferromagnetic interlayer and measured for exchange coupling magnetic field Hua. The results, as well as the types of the materials a-$(Co_{0.9}Fe_{0.1})X$ and Y, are shown in the following Table 3.

TABLE 3

| a-$(Co_{0.9}Fe_{0.1})X/Y$ | | |
|---|---|---|
| X | Y | Hua(Oe) |
| B | $Ni_{80}Fe_{20}$ | 125 |
| Zr | $Ni_{80}Fe_{20}$ | 120 |
| Ta | $Ni_{80}Fe_{20}$ | 120 |
| Nb | $Ni_{80}Fe_{20}$ | 125 |
| B | $Ni_{20}Co_{80}$ | 130 |
| Zr | $Ni_{20}Co_{80}$ | 115 |
| Ta | $Ni_{20}Co_{80}$ | 125 |
| Nb | $Ni_{20}Co_{80}$ | 120 |
| B | $Co_{20}Fe_{80}$ | 125 |
| Zr | $Co_{20}Fe_{80}$ | 115 |
| Ta | $Co_{20}Fe_{80}$ | 115 |
| Nb | $Co_{20}Fe_{80}$ | 135 |

In the above Table 3, the X content was in the range of 2–20 atomic percent.

Also, investigations were made as to the thickness of the crystalline ferromagnetic interlayer sufficient to produce the exchange coupling magnetic field Hua, for the magnetoresistive films consisting of various material combinations listed in Tables 1, 2 and 3. It has been found from the investigations that setting the thickness of the crystalline ferromagnetic interlayer to not lower than 1 nm is effective in enhancing the exchange coupling magnetic field Hua.

As will be appreciated from Tables 1, 2 and 3, any material which consists principally of Co can be employed for the amorphous ferromagnetic layer in accordance with the present invention. Also, any material can be employed for the crystalline ferromagnetic interlayer, so long as it is crystalline and ferromagnetic.

Although at least one of the ferromagnetic layers for flanking the nonmagnetic conductive layer therebetween was described as comprising amorphous ferromagnetic materials in the above-described embodiments, the present invention is not intended to limit the other ferromagnetic layer(s), if present, to such amorphous ferromagnetic materials. Excluding the ferromagnetic layers adjacent to the crystalline ferromagnetic layer, the other ferromagnetic layer(s), if present, may be comprised of suitable crystalline ferromagnetic materials.

It should be understood that the material type and thickness of each layer in the magnetoresistive film of the present invention are not limited to those described in conjunction with the above embodiments.

The magnetoresistive film in accordance with the present invention exhibits a high MR ratio and can be fabricated in such a reproducible manner to maintain its quality level. Accordingly, the magnetoresistive film of the present invention can find its utilities in reproduce magnetic heads, magnetic sensors and the like.

What is claimed is:

1. A magnetoresistive film comprising:
   an antiferromagnetic layer;
   a first amorphous ferromagnetic layer;
   a crystalline ferromagnetic interlayer disposed between said antiferromagnetic layer and said first amorphous ferromagnetic layer;
   a non magnetic conductive layer provided on said first amorphous ferromagnetic layer; and a ferromagnetic layer provided on said nonmagnetic conductive layer;

wherein said crystalline ferromagnetic interlayer is ferromagnetically coupled to said amorphous ferromagnetic layer, so that the ferromagnetically coupled crystalline ferromagnetic interlayer and amorphous ferromagnetic layer are magnetically coupled to said antiferromagnetic layer.

2. The magnetoresistive film of claim 1, wherein said crystalline ferromagnetic interlayer is formed of at least one metallic material selected from the group consisting of Fe, Co, Ni and alloys thereof.

3. The magnetoresistive film of claim 2, wherein said crystalline ferromagnetic interlayer comprises NiFe, NiCo or CoFe.

4. The magnetoresistive film of claim 1, wherein said ferromagnetic layer is a second amorphous ferromagnetic layer.

5. The magnetoresistive film of claim 1, wherein said first amorphous ferromagnetic layer comprises an amorphous ferromagnetic material comprised principally of Co.

6. The magnetoresistive film of claim 5, wherein said first amorphous ferromagnetic layer is formed of at least one alloy selected from the group consisting of CoFeB, CoNb, CoZr, CoZrNb, CoTa, CoTaZr and CoNbTa.

7. The magnetoresistive film of claim 5, wherein said first amorphous ferromagnetic layer is formed of at least one alloy selected from the group consisting of CoB, CoFeZr, CoFeTa, CoFeNb, CoNiB, CoNiZr, CoNiTa and CoNiNb.

8. A magnetoresistive film having a multilayer structure in which the layered sequence of the magnetoresistive film of claim 1 is repeated two or more times.

* * * * *